United States Patent
Kim

Patent Number: 5,615,075
Date of Patent: Mar. 25, 1997

[54] AC/DC CURRENT SENSOR FOR A CIRCUIT BREAKER

[75] Inventor: Edward E. Kim, Burlington, Conn.

[73] Assignee: General Electric Company, New York, N.Y.

[21] Appl. No.: 452,936

[22] Filed: May 30, 1995

[51] Int. Cl.⁶ .................................................. H02H 3/26
[52] U.S. Cl. ........................... 361/87; 361/93; 324/117 H
[58] Field of Search ................................. 361/42–50, 87, 361/93, 102, 114, 115; 324/127, 144, 146, 147, 151 R, 151 A, 522, 117 R, 117 H; 323/277, 368, 358, 362

[56] References Cited

U.S. PATENT DOCUMENTS

| | | | |
|---|---|---|---|
| 2,928,048 | 3/1960 | Postal | 324/117 H |
| 3,449,703 | 6/1969 | Steen | 324/127 |
| 3,621,334 | 11/1971 | Burns et al. | 361/45 |
| 4,591,942 | 5/1986 | Willard et al. | 361/97 |
| 4,672,501 | 6/1987 | Bilac et al. | 361/42 |
| 4,709,339 | 11/1987 | Fernandes | 324/127 |
| 5,103,163 | 4/1992 | Molyman | 324/127 |
| 5,196,982 | 3/1993 | Landsberg et al. | 361/93 |

*Primary Examiner*—Jeffrey A. Gaffin
*Assistant Examiner*—Ronald W. Leja
*Attorney, Agent, or Firm*—Richard A. Menelly; Carl B. Horton

[57] ABSTRACT

A current sensor has a closed loop magnetic flux concentrating ferromagnetic core with a gap and a central aperture for receiving a conductor. A Hall generator is positioned in the gap and a secondary winding is positioned on a portion of the core. Current flow in the conductor creates magnetic flux in the core which energizes the secondary winding to provide a power output. Magnetic flux concentrated in the gap causes the Hall generator to output a sensing signal that is proportional to the magnetic flux which is proportional to the current flow in the conductor. The single core is used to simultaneously produce a sensing signal proportional to alternating or direct current flow in the conductor.

17 Claims, 1 Drawing Sheet

AC/DC CURRENT SENSOR FOR A CIRCUIT BREAKER

TECHNICAL FIELD OF THE INVENTION

The present invention relates generally to circuit breakers, and, more particularly, to a current sensor for sensing current flow and signaling an electronic trip unit of a microprocessor controlled, molded case circuit breaker.

BACKGROUND OF THE INVENTION

In a circuit breaker, current transformers are used to continuously sense the current level and to trip the circuit breaker when the rated current level is exceeded. Whether they are in toroidal or laminated form, the current transformers within a circuit breaker provide a continuous sample of the current level to the electronic trip unit. One example of a current transformer used within circuit breaker electronic trip units is found in U.S. Pat. No. 3,449,703 entitled "Current Transformer Having an Accuracy Unimpaired by Stray Flux Adjacent Conductors". A further example is found in U.S. Pat. No. 4,591,942 entitled "Current Sensing Transformer Assembly".

Using a single iron core current transformer with multiple windings to both sense the circuit current and provide operating power to the electronic trip unit provides the advantage of reducing bulky components and conserving space which is often limited in a molded case circuit breaker. Solid state devices, such as a Hall Effect transducer can also help conserve space, however, to date, the use of a solid state device has not proven feasible as a current sensor because of its poor performance and inaccuracy in sensing the current level. Examples of a Hall effect current sensor are found in U.S. Pat. No. 3,621,334 entitled "Ground Fault Sensing Circuit" and U.S. Pat. No. 5,196,982 entitled "Electrical Power Monitoring System". Accordingly, it would be highly desirable to have a current sensor that uses a solid state device to provide a sensing signal that accurately reflects the current level in the circuit breaker.

SUMMARY OF THE INVENTION

The present invention is directed to overcoming one or more of the problems set forth above. Briefly summarized, according to one aspect of the invention, a current sensor comprises a closed loop magnetic flux concentrating core having a gap and a central aperture for receiving a conductor, a Hall generator positioned in the gap with output terminals for delivering a sensing signal in response to current flow in the conductor, and a secondary winding on the core producing a power output in response to current flow in the conductor.

Providing a gap in the closed loop core concentrates magnetic flux in the gap for the Hall generator. A linear Hall generator responds to the flux by producing a sensing signal that is proportional to flux density, which, in turn, is proportional to current flow in the conductor. Because the flux is present whenever there is current flow in the conductor, the Hall generator responds to both alternating and direct current. Whenever the flux changes, the secondary winding produces a power output. The single core provides flux to simultaneously produce the power output and sensing signal.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE PREFERRED EMBODIMENTS

Figure 1:
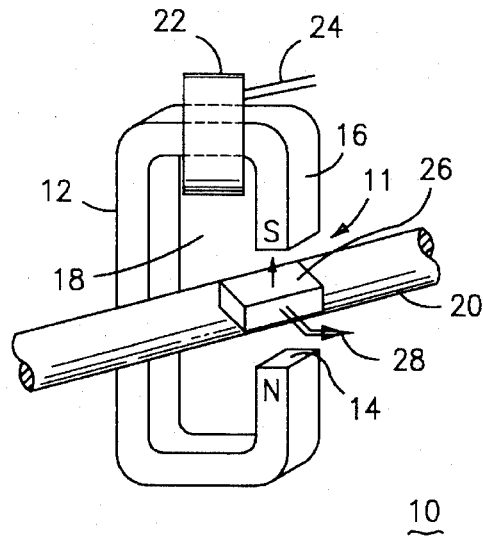
FIG. 1 is a front perspective view of a preferred embodiment of current sensor for a microprocessor controlled trip unit of a molded case circuit breaker according to the present invention.

Referring to FIG. 1, current sensor 10 has a closed loop magnetic flux concentrating core 12 with a gap 11 defining first and second poles 14, 16 on either side of the gap and with a central aperture 18 for receiving a conductor 20. When current flows in the conductor 20, the north and south poles 14, 16 concentrate magnetic flux in the gap. The core 12 is preferably constructed of a ferromagnetic material and is preferably laminated. A secondary winding 22 is wound about the core 12 at a location closer to one of the poles 14, 16 than the other and extends through the aperture 18. A single continuous strand of insulated wire may be wound about the core 12 to form the secondary winding, or the secondary winding may be formed of multiple strands of insulated wire. The secondary winding 22 has pair of power take-off leads 24 for delivering the power developed in the secondary winding 22 in response to the current flow in conductor 20.

When current flows through the conductor 20, in the direction of the arrow, magnetic flux is developed in the core 12 such that the first pole 14 becomes a north magnetic pole and the second pole 16 becomes a south magnetic pole. A Hall generator 26 is positioned in the gap between the magnetic poles to produce a sensing signal in response to the current flow in the conductor 20. Because flux is concentrated in the gap between the poles, the linear Hall generator responds to the flux by producing a sensing signal that is proportional to flux density, which, in turn, is proportional to current flow in the conductor. The output voltage of the Hall generator is directly proportional to the flux density for a given area at the Hall generator. This output is defined by the expression:

$$V_h = K I_c B$$

where $V_h$ is the Hall voltage, K is a constant, $I_c$ is the conductor current and B is the magnetic flux density. By holding $I_c$ constant, $V_h$ becomes a direct function of B, the magnetic flux density. A pair of output terminals 28 deliver the sensing signal which is proportional to current flow in the conductor when the Hall generator is a linear device. Because the secondary winding 22 and Hall generator 26 are both dependent upon current flow in the conductor 20, power from the secondary winding 22 and the sensing signal from the Hall generator 26 are produced simultaneously from the single core.

Figure 2:
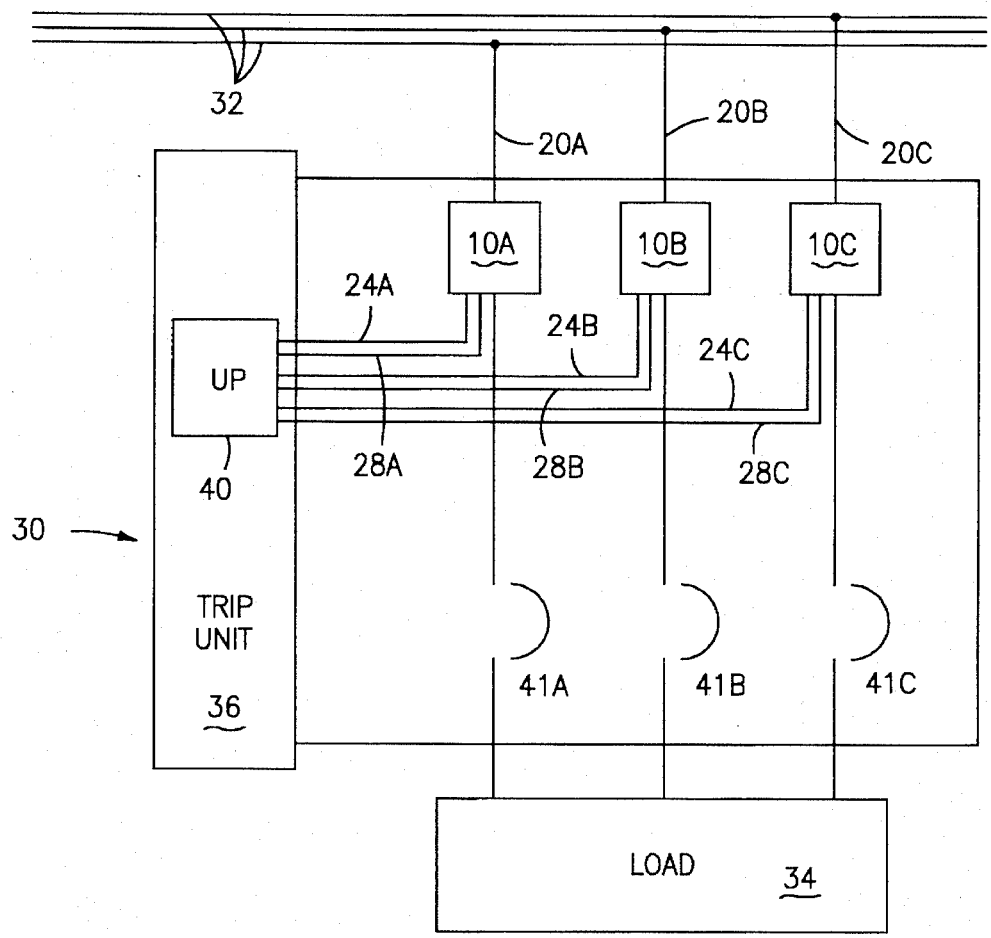
FIG. 2 is a diagrammatic front view of a molded case circuit breaker incorporating the current sensor of FIG. 1.

Referring to FIGS. 1 and 2, a molded case circuit breaker 30 is connected between a line 32 and a load 34 by means of power conductors 20A–C. The circuit breaker 30 contains a trip unit 36 and a microprocessor controller 40 similar to the trip unit contained within U.S. Pat. No. 4,672,501 entitled "Circuit Breaker and Protective Relay Unit". The power take-off leads 24A–C from the secondary winding 22 power the trip unit 36 for tripping the circuit breaker contacts 41A–C. The sensing signals from the current sensors 10A–C are connected to the microprocessor controller 40 via conductors 28A–C. Current flow through either of the conductors 20a–d creates magnetic flux in its associated magnetic core which energizes the secondary winding providing power to the trip unit 36. Simultaneously, the current sensors provide sensing signals to the microprocessor 40. When the sensing signals reach a predetermined value it is indicative of an over-current condition. Microprocessor 40 signals the trip unit 36 to trip the breaker to disconnect the load from the line.

The Hall generator 26 positioned between the poles 14, 16 in the gap of the core 12 may be a two terminal device or a multi-terminal device. It is preferably a linear device so that the magnitude of the sensing signal is proportional to current flow in the conductor. To ensure stability, excitation current for the Hall generator may be controlled by the microprocessor controller.

It can now be appreciated that an ac/dc current sensor has been presented. The current sensor has a closed loop magnetic flux concentrating ferromagnetic core with a gap and a central aperture for receiving an ac/dc current carrying conductor. A Hall generator is positioned in the gap and a secondary winding is positioned on the core. Current flow in the conductor creates magnetic flux in the core which energizes the secondary winding to provide a power output for the trip unit of a circuit breaker. Magnetic flux concentrated in the gap causes the Hall generator to output a sensing signal for the microprocessor controller that is proportional to the magnetic flux which is proportional to the current flow in the conductor. The single core is used to simultaneously produce a sensing signal proportional to alternating or direct current flow in the conductor and provide a power signal for the trip unit.

While the invention has been described with particular reference to the preferred embodiments, it will be understood by those skilled in the art that various changes may be made and equivalents may be substituted for elements of the preferred embodiments without departing from invention. It is accordingly intended that the claims shall cover all such modifications and applications as do not depart from the true spirit and scope of the invention.

What is claimed is:

1. A current sensor, comprising:
    a magnetic flux concentrating core having a gap defining first and second poles on either side of said gap, said core having a central aperture for receiving a conductor;
    a Hall generator, positioned in said gap between said first and second poles, said Hall generator having output terminals for delivering a sensing signal in response to current flow in said conductor; and
    a secondary winding on said core extending through said aperture, said secondary winding producing operating power in response to current flow in said conductor.

2. The current sensor of claim 1, wherein said Hall generator comprises a linear device.

3. The current sensor of claim 1 wherein said power and sensing signal are delivered simultaneously.

4. The current sensor of claim 1 wherein excitation current for said Hall device is controlled by a microprocessor.

5. The current sensor of claim 1 wherein said flux concentrating core contains a ferromagnetic material.

6. The current sensor of claim 1 wherein said secondary winding is a single continuous strand of insulated wire wound about said core.

7. The current sensor of claim 1 wherein said secondary winding is positioned on said core at a location closer to one of said first and second poles than the other.

8. A current sensor for sensing current in a conductor of a circuit breaker, having a microprocessor and an electronic trip unit, said current sensor comprising:
    a magnetic flux concentrating core having a gap defining first and second poles on either side of said gap, said core having a central aperture for receiving said conductor;
    a Hall generator, positioned in said gap between said first and second poles, and having output terminals for delivering a sensing signal to said trip unit in response to current flow in said conductor; and
    a secondary winding extending through said aperture, delivering operating power to said trip unit in response to current flow in said conductor, said operating power and said sensing signal being delivered simultaneously.

9. The current sensor of claim 8 wherein said secondary winding is positioned on said core at a location closer to one of said first and second poles than the other.

10. The current sensor of claim 8 wherein said Hall generator is a linear device.

11. The current sensor of claim 8 wherein excitation current for said Hall device is controlled by said microprocessor.

12. The current sensor of claim 8 wherein said flux concentrating core contains a ferromagnetic material.

13. The current sensor of claim 8 wherein said secondary winding is a single continuous strand of insulated wire wound about said core.

14. A circuit breaker comprising:
    a pair of contacts arranged for connecting between a current source and an associated load;
    an electronic trip unit arranged for separating said contacts upon occurrence of an overcurrent condition determined by said trip unit; and
    current sensing means arranged electrically with said load, said current sensing means comprising a magnetic core having a secondary winding providing operating power to said trip unit and further comprising a semiconductor device in magnetic proximity to said core, said semiconductor device providing sensing current to said trip unit in proportion to current flow through said contacts.

15. The circuit breaker of claim 14 wherein said core includes a gap defining first and second poles on either side of said gap and having a central aperture for receiving a conductor.

16. The circuit breaker of claim 15 wherein said semiconductor device comprises a Hall generator, positioned in said gap between said first and second poles, said generator having output terminals for delivering a sensing signal in response to current flow in said conductor.

17. The circuit breaker of claim 16 further including a source of excitation current for said Hall generator.

* * * * *